United States Patent
Hwang et al.

(10) Patent No.: US 11,378,605 B2
(45) Date of Patent: Jul. 5, 2022

(54) METHOD FOR HIGH-INTENSITY RADIATED FIELD (HIRF) AND ELECTROMAGNETIC PULSE (EMP) ANALYSIS OF A VEHICLE

(71) Applicant: The Boeing Company, Chicago, IL (US)

(72) Inventors: Kyu-Pyung Hwang, Ladson, SC (US); Young Kyu Song, San Diego, CA (US)

(73) Assignee: The Boeing Company, Chicago, IL (US)

( * ) Notice: Subject to any disclaimer, the term of this patent is extended or adjusted under 35 U.S.C. 154(b) by 241 days.

(21) Appl. No.: 16/742,565

(22) Filed: Jan. 14, 2020

(65) Prior Publication Data

US 2021/0215748 A1     Jul. 15, 2021

(51) Int. Cl.
| | |
|---|---|
| *G01R 29/08* | (2006.01) |
| *H01P 1/161* | (2006.01) |
| *B64F 5/60* | (2017.01) |
| *H04B 17/391* | (2015.01) |
| *G01S 3/02* | (2006.01) |
| *G01S 1/02* | (2010.01) |
| *G01R 31/00* | (2006.01) |

(52) U.S. Cl.
CPC ............ *G01R 29/0821* (2013.01); *B64F 5/60* (2017.01); *G01R 29/0892* (2013.01); *G01S 1/028* (2013.01); *G01S 3/026* (2013.01); *H01P 1/161* (2013.01); *H04B 17/3912* (2015.01); *H04B 17/3913* (2015.01); *G01R 31/008* (2013.01)

(58) Field of Classification Search
None
See application file for complete search history.

(56) References Cited

U.S. PATENT DOCUMENTS

| | | | |
|---|---|---|---|
| 2003/0072130 A1* | 4/2003 | Tsang | G06F 30/367 361/679.01 |
| 2013/0138402 A1* | 5/2013 | Fang | G06F 30/367 703/2 |

OTHER PUBLICATIONS

D. M. Pozar, Microwave Engineering, New York: Addison-Wesley, 1990, 10 pages.

\* cited by examiner

*Primary Examiner* — Jermele M Hollington
*Assistant Examiner* — Suresh K Rajaputra
(74) *Attorney, Agent, or Firm* — Haynes and Boone, LLP

(57) ABSTRACT

A method for modeling electromagnetic characteristics of a vehicle having electrical components comprising generating a parallel plate waveguide model and inserting a vehicle model for the vehicle within the parallel plate waveguide model. The vehicle model has a plurality of lumped ports corresponding to on-board electrical components. The method executes an electromagnetic field solver on a first and second waveguide ports and the lumped ports and determines a scaling factor between a first power level configured to excite the first and/or second waveguide ports and a second power level configured to excite the lumped ports. The electromagnetic field solver runs on the first and second waveguide and lumped ports, producing a first output data and the method produces a scattering parameter (S-parameter) model for the vehicle from the first output data that includes a plurality of S-parameter ports.

20 Claims, 6 Drawing Sheets

METHOD FOR HIGH-INTENSITY RADIATED FIELD (HIRF) AND ELECTROMAGNETIC PULSE (EMP) ANALYSIS OF A VEHICLE

BACKGROUND

1. Technical Field

The field of the invention relates generally to systems and methods of analyzing and testing the electrical properties of a vehicle, and more specifically, to methods and systems for analyzing and testing the high-intensity radiated field (HIRF) and/or electromagnetic pulse (EMP) characteristics of the vehicle.

2. Prior Art

At present, determining the HIRF and/or EMP characteristics of a vehicle, such as an aircraft, is very important. For example, HIRF and/or EMP analysis and testing is an essential part of aircraft development and certification. The reason for this is that aircraft and other types of vehicles (such as, for example, military types of ships or ground vehicles) have increased their use of mission critical equipment, new composite materials that have reduced electromagnetic shielding, electrical and electronic systems configured to perform more flight and landing functions, and new devices and systems that are susceptible to HIRF due to increased data bus and processor operating speeds, higher density integrated circuits and cards, and greater general sensitivities of the electronic equipment.

Generally, determining the HIRF and/or EMP characteristics of these types of vehicles involves placing the vehicle within an outdoor range where the vehicle is surrounded by radiating sensors that emit plane wave signals that are radiated at the vehicle, scattered by the vehicle, and correspondingly detected by the radiating sensors. This process is repeated for different angles of incidence towards the vehicle. The detected signals are then utilized to analyze the HIRF and/or EMP characteristics of the vehicle. Unfortunately, this type of outdoor field testing is expensive and time-consuming.

Approaches to address these problems have included attempting to replace the expensive and time-consuming outdoor field testing with a computer modeling approach. Unfortunately, due to the ever-increasing complexity of electrical systems in modern vehicles, such as aircraft, efficient aircraft-scale HIRF and/or EMP analysis is computationally prohibitive because an aircraft-scale plane wave incidence electromagnetic (EM) simulation run with a specific signal waveform and propagation direction and/or polarization may take days in a multi-node cluster process and produce tens of gigabytes of data. Moreover, for each different signal waveform and propagation direction and/or polarization, an expensive EM simulation must be launched and run, and the resulting huge amount of data must be saved in storage. Furthermore, as the electrification of aircraft continues to make rapid progress and more sophisticated electronics are integrated on-board, the computational complexity of modeling "victim" components (e.g., cables, connectors, system board, etc.) for HIRF and/or EMP analysis is ever more challenging. As such, there is a need for a system and method to address these issues.

SUMMARY

A method for modeling electromagnetic characteristics of a vehicle having electrical components is disclosed. The method comprises generating a parallel plate waveguide model having a first waveguide port and a second waveguide port and inserting a vehicle model for the vehicle within the parallel plate waveguide model. The vehicle model has a plurality of lumped ports corresponding to the electrical components on-board the vehicle. The method further comprises executing an electromagnetic field solver on the first waveguide port, the second waveguide port, and the plurality of lumped ports and determining a scaling factor between a first power level configured to excite the first waveguide port and/or the second waveguide port and a second power level configured to excite the plurality of lumped ports. The electromagnetic field solver is executed on the first waveguide port, the second waveguide port, and the plurality of lumped ports, and the electromagnetic field solver produces a first output data. The method further comprises producing a scattering parameter (S-parameter) model for the vehicle from the first output data, where the S-parameter model includes a plurality of S-parameter ports, generating a plurality of excitation signals at the plurality of S-parameter ports, where the scaling factor has been applied to the plurality of excitation signals, and executing a time-domain circuit simulation to model the electromagnetic characteristics of the vehicle.

Other devices, apparatuses, systems, methods, features, and advantages of the invention will be or will become apparent to one with skill in the art upon examination of the following figures and detailed description. It is intended that all such additional devices, apparatuses, systems, methods, features, and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Disclosed is a method for modeling electromagnetic characteristics of a vehicle having electrical components. The method comprises generating a parallel plate waveguide model having a first waveguide port and a second waveguide port and inserting a vehicle model for the vehicle within the parallel plate waveguide model. The vehicle model has a plurality of lumped ports corresponding to the electrical components on-board the vehicle. The method further comprises executing an electromagnetic field solver on the first waveguide port, the second waveguide port, and the plurality of lumped ports and determining a scaling factor between a first power level configured to excite the first waveguide port and/or the second waveguide port and a second power level configured to excite the plurality of lumped ports. The electromagnetic field solver is executed on the first waveguide port, the second waveguide port, and the plurality of lumped ports, and the electromagnetic field solver produces a first output data. The method further comprises producing a scattering parameter (S-parameter) model for the vehicle from the first output data, where the S-parameter model includes a plurality of S-parameter ports, generating a plurality of excitation signals at the plurality of S-parameter ports, where the scaling factor has been applied to the plurality of excitation signals, and executing a time-domain circuit simulation to model the electromagnetic characteristics of the vehicle.

Figure 1:
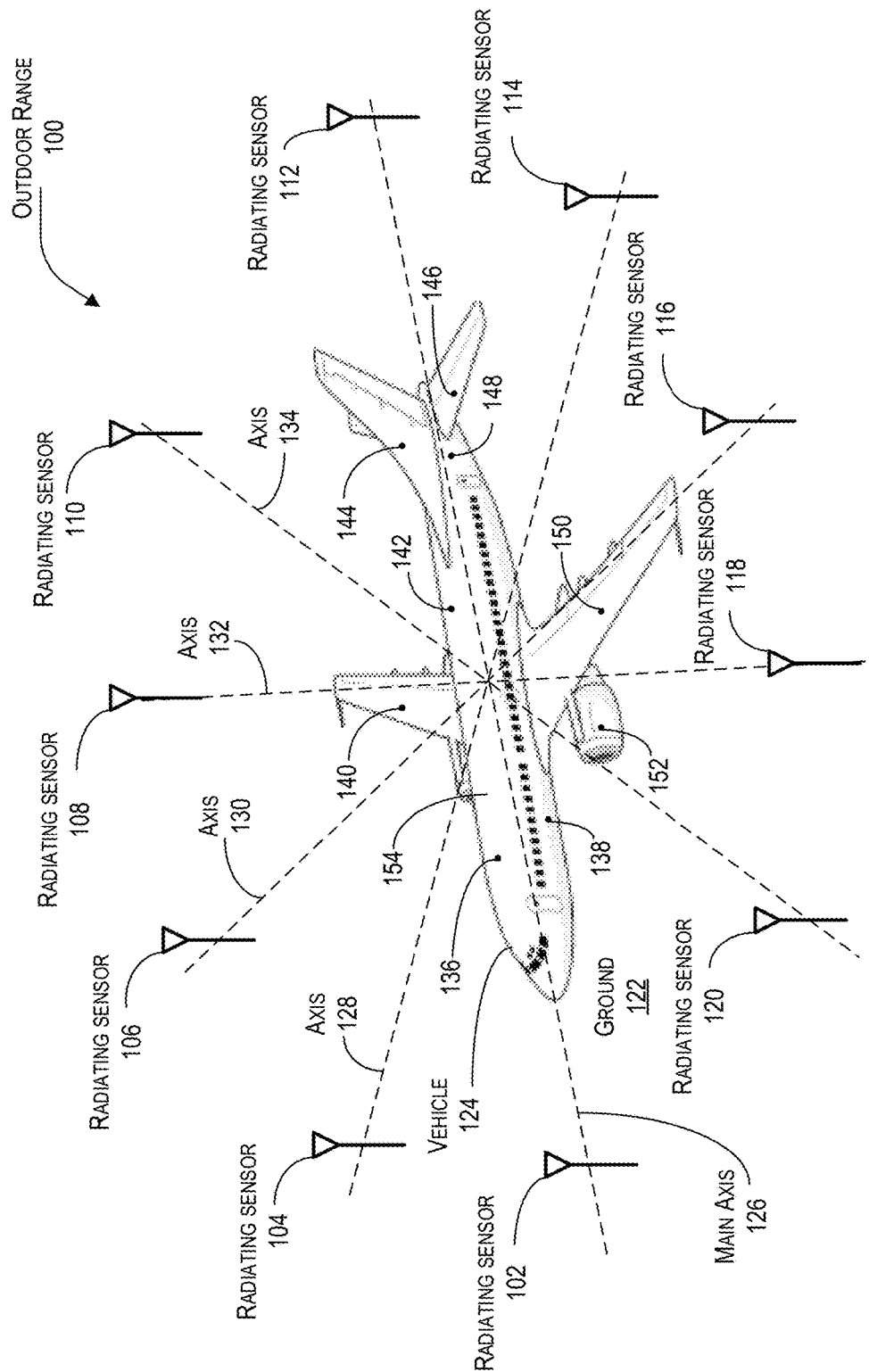
FIG. 1 is a system diagram of a conventional outdoor range.

In FIG. 1, a system diagram of a conventional outdoor range 100 is shown. In this example, the outdoor range 100 includes a plurality of radiating sensors 102, 104, 106, 108, 110, 112, 114, 116, 118, and 120 arranged in an approximate circle along the ground 122. A vehicle 124 (in this example an aircraft) is placed on the ground 122 within the area of the approximate circle defined by the radiating sensors 102, 104, 106, 108, 110, 112, 114, 116, 118, and 120. In this example, the radiating sensors 102, 104, 106, 108, 110, 112, 114, 116, 118, and 120 may be antenna elements capable of both transmitting and receiving signals and the vehicle 124 may be oriented along a main axis 126 that extends between the radiating sensors 102 and 112. The other radiating sensors 104, 106, 108, 110, 114, 116, 118, and 120 may extend along minor axes 128, 130, 132, and 134. In this example, the number of radiating sensors 102, 104, 106, 108, 110, 112, 114, 116, 118, and 120 may vary based on the design of the outdoor range 100.

In addition to the plurality of radiating sensors 102, 104, 106, 108, 110, 112, 114, 116, 118, and 120, the vehicle 124 may also include a plurality of vehicle sensors 136, 138, 140, 142, 144, 146, 148, 150, and 152 located on the surface 154 of the vehicle 124 and within the vehicle 124. In this example, the vehicle sensors within the vehicle 124 are not shown but are located within the vehicle 124 for HIRF/EMP field tests.

Figure 2:
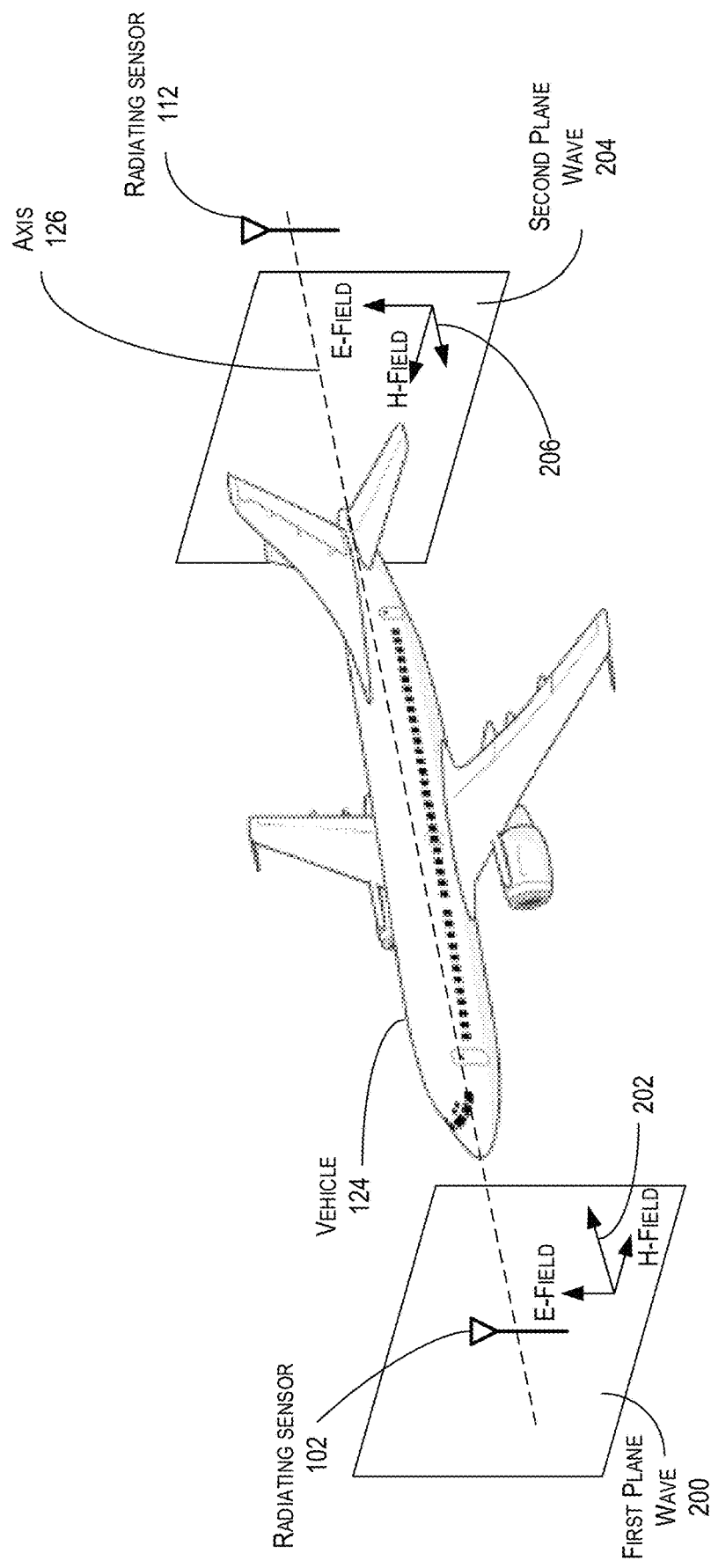
FIG. 2 is a system diagram of an operation of the outdoor range shown in FIG. 1.

In FIG. 2, a system diagram of an operation of the outdoor range 100 is shown. In this example, a boresight first plane wave 200 is shown being radiated from the first radiating sensor 102 to the front of the vehicle 124 along the main axis 126 in a first direction 202 towards the second radiating sensor 112. Likewise, a second plane wave 204 is shown being radiated from the second radiating sensor 112 to the back of the vehicle 124 along the main axis in a second direction 206 towards the first radiating sensor 102.

The resulting scattering of the first plane wave 200, or second plane wave 204, caused by the vehicle 124 is detected by the other radiating sensors 104, 106, 108, 110, 114, 116, 118, and 120 and utilized to produce the HIRF and/or EMP characteristics of the vehicle for a given angle of incidence towards the vehicle 124. This process is then repeated for different angles of incidence around the vehicle 124. Unfortunately, this type of outdoor field testing is expensive and time-consuming.

Figure 3:
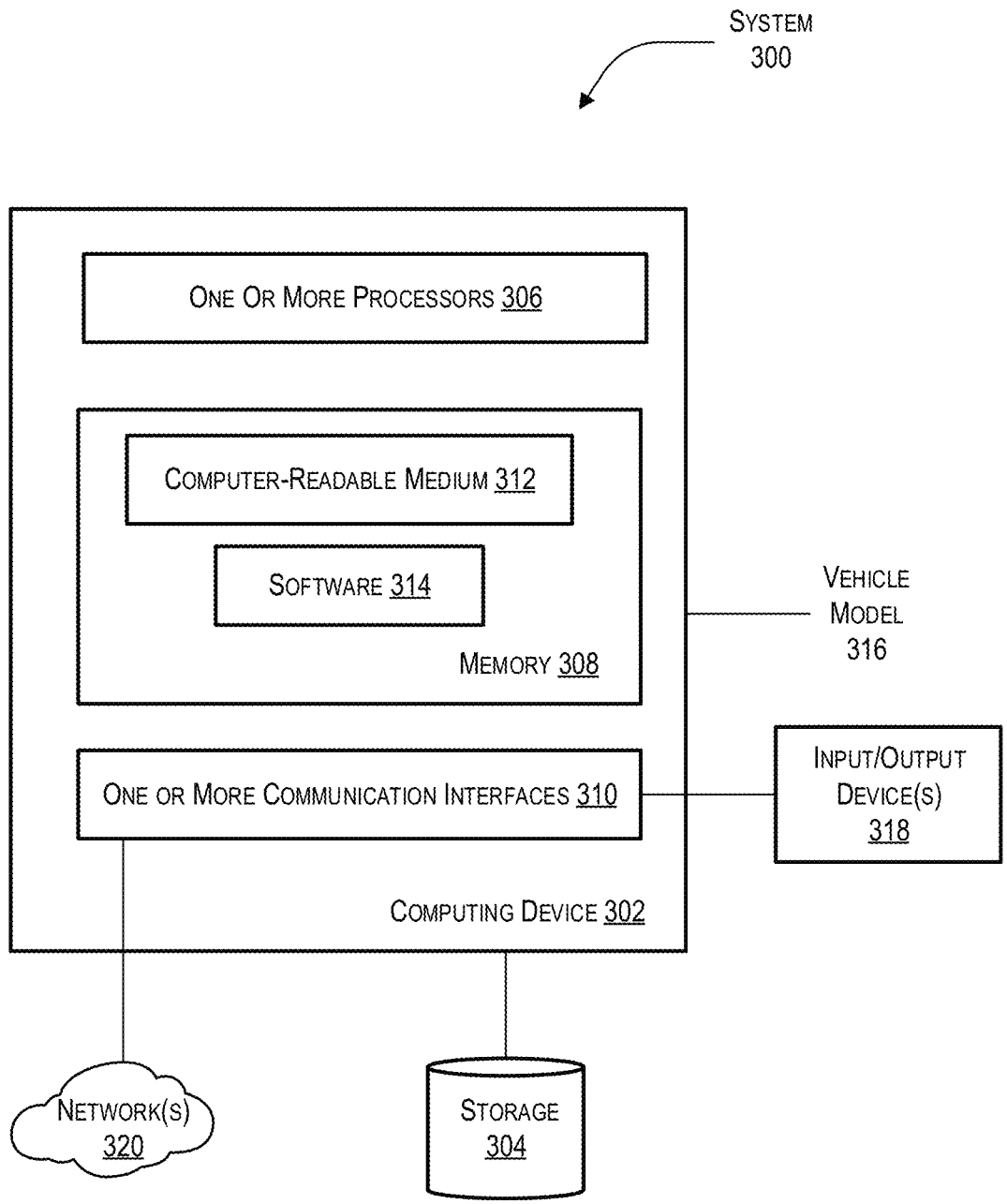
FIG. 3 is a system diagram of an example of an implementation of a system for modeling the electromagnetic characteristics of a vehicle in accordance with the present disclosure.

In FIG. 3, a system diagram of an example of an implementation of a system 300 for modeling electromagnetic characteristics of a vehicle 124 is shown in accordance with the present disclosure. In this example, the system 300 may include a computing device 302 and a storage 304. The storage 304 may be, for example, a hard drive, a memory module (e.g., random access memory (RAM) and/or read-only memory (ROM)), flash drive, or other type of storage device. The computing device 302 may include one or more processors 306 (also known as processing units), a memory 308, and one or more communication interfaces 310. The memory 308 may include a computer-readable medium 312 (also known as a computer-readable media, machine-readable medium, or machine-readable media) and software 314. In this example, the computer-readable medium 312 stores executable instructions that, when executed by the one or more processors 306, cause the system 300 to perform the method described in FIG. 4. In this example, the computing device 302 may receive a vehicle model 316 from an external source such as, for example, the storage 304 or another external device. Alternatively, the vehicle model 316 may be generated by the computing device 302 from measured test data of the vehicle 124 previously taken at an outdoor range. In general, the vehicle model 316 is a computer-generated model of the vehicle 124 that includes the electrical characteristics of the vehicle 124.

In this example, the computing device 302 may belong to a variety of classes of devices, such as traditional client-type devices, desktop computer-type devices, server computer-type devices, or special purpose-type devices. Thus, the computing device 302 may be (but is not limited to) a desktop computer, a work station, a server, a distributed computing system, or any other sort of computing device having sufficient computational power to run the method for modeling the electromagnetic characteristics of the vehicle 124.

The one or more communication interfaces 310 may include input/output ("I/O") interfaces (not shown) that enable communications with input/output devices 318 such as, for example, user input devices that include peripheral input devices (e.g., a keyboard, a mouse, a pen, a voice input device, a touch input device, a gestural input device, and the like) and/or output devices that include peripheral output devices (e.g., a display, a printer, audio speakers, and the like). The one or more communication interfaces 310 may also enable communications between the computing device 302 and other networked devices, such as other remote computing devices (not shown), servers (not shown) and/or other external devices over the one or more network(s) 320. In this example, the one or more communication interfaces 310 may include one or more network interface controllers (NICs) or other types of transceiver devices to send and receive communications and/or data over the one or more network(s) 320. As an example, the computing power of the computing device 302 may be increased by distributing computations with other computing devices that are connected to the computing device 302 via the one or more network(s) 320.

The one or more processors 306 may be operably connected to the computer-readable medium 312 via a bus, which may include one or more system buses, a data bus, an address bus, a PCI bus, a Mini-PCI bus, and any variety of local, peripheral, and/or independent buses. The executable instructions stored on the computer-readable medium 312 may include, for example, an operating system, a client module, a profile module, and other software modules, programs, or applications that are loadable and executable by the one or more processors 306.

Figure 4:
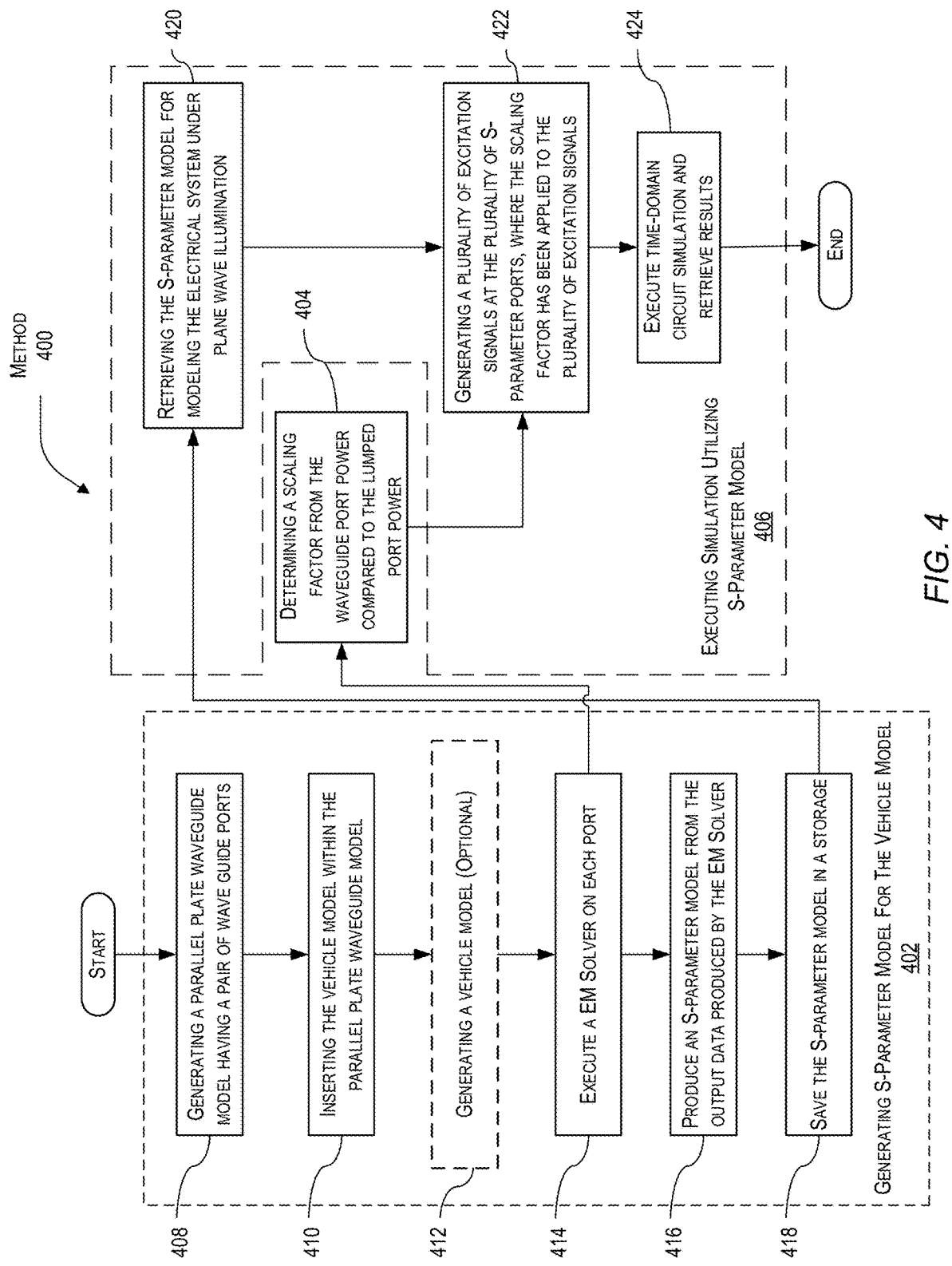
FIG. 4 is a flowchart of an example of an implementation of a method performed by the system shown in FIG. 3 in accordance with the present disclosure.

In FIG. 4, a flowchart of an example of an implementation of a method 400 performed by the system 300 is shown in accordance with the present disclosure. Generally, the method 400 includes first generating 402 an S-parameter model for the vehicle 124, determining 404 a scaling power factor (e.g. from a waveguide port power compared to the lumped port power), and executing 406 a simulation utilizing the S-parameter model 406.

Specifically, the method 400 starts and generates 408 a parallel plate waveguide model having a first waveguide port and a second waveguide port and inserts 410 the vehicle model 316 for the vehicle 124 within the parallel plate waveguide model, where the vehicle model 316 has a plurality of lumped ports corresponding to the electrical components of the vehicle 124. The method 400 may also include an optional step of generating 412 the vehicle model 316 (e.g. an aircraft model) with the computing device 302. The method 400 then executes 414 an electromagnetic field (e.g. EM) solver on the first waveguide port, the second waveguide port, and the plurality of lumped ports, where the electromagnetic field solver produces a first output data including scattering parameter (S-parameter) data. In general, as appreciated by those of ordinary skill of the art, an EM solver (also known as a "field solver") is a specialized program that solves (a subset of) Maxwell's equations directly. The method 400 further determines 404 a scaling factor between a first power level configured to excite the first waveguide port and the second waveguide port, and a second power level configured to excite the plurality of lumped ports and produces 416 a S-parameter model for the vehicle model 316 from the first output data, where the S-parameter model includes a plurality of S-parameter ports. The method 400 then saves 418 the S-parameter model in the storage 304 such as a computer memory. In this example, the stored S-parameter model is reusable for executing a system level transient simulation utilizing the S-parameter model at a later time. As an example, the S-parameter model may be saved in storage 304 as a Touchstone or SnP file.

The method 400 then executes 406 the simulation utilizing the S-parameter model by retrieving 420 the S-parameter model for modeling the electrical system under plane wave illumination and generating 422 a plurality of excitation signals at the plurality of S-parameter ports, where the scaling power factor (from step 404) has been applied to the plurality of excitation signals. The method 400 then executes 424 a time-domain circuit simulation to model the electromagnetic characteristics of the vehicle model 316 and the method 400 ends.

In this example, the vehicle model 316 may be predetermined in that it is an electrical representation of the vehicle 124 that has been created prior to its use in the present method 400. However, the system 300 may be part of a larger system (not shown) that includes an outdoor range and is capable of testing the vehicle 124 to produce the vehicle model 316 (as recited in step 412 above) with the computing device 302.

In this disclosure, each lumped port of the plurality of lumped ports is configured to have electrical properties corresponding to an on-board component, device, module, or system of the vehicle 124 and the first waveguide port and the second waveguide port are configured to simulate a plane wave illumination of the vehicle 124. As an example, if the vehicle model 316 is an aircraft, the lumped ports may represent an avionic on-board component, device, module, or system terminals inside the aircraft that are usually connected to each other by cables that may be part of a cable harness (also known as a wire harness).

When determining 404 the scaling factor, the first power level is higher than the second power level because the first power level is a simulated power level of the first plane wave 200 and/or second plane wave 204 that are directed at the entire outside surface of the vehicle model 316. In this example, the first power level is determined based a cross-section of a waveguide defined by the parallel plate waveguide model and an incident plane wave generated by the electromagnetic field solver at the first waveguide port or the second waveguide port. The second power level is lower than the first power level because the second power level represents a power level that is sufficient to power the individual lumped ports of the plurality of lumped ports that correspond to the on-board components, devices, modules, or systems of the vehicle model 316. Based on the design tool utilized, the second power level may vary. As an example, if a CST Suite T-solver (produced by Dassault Systèmes of Vélizy-Villacoublay, France) is utilized, the second power level may be, for example, approximately 0.5 Watts (rms).

Figure 5:
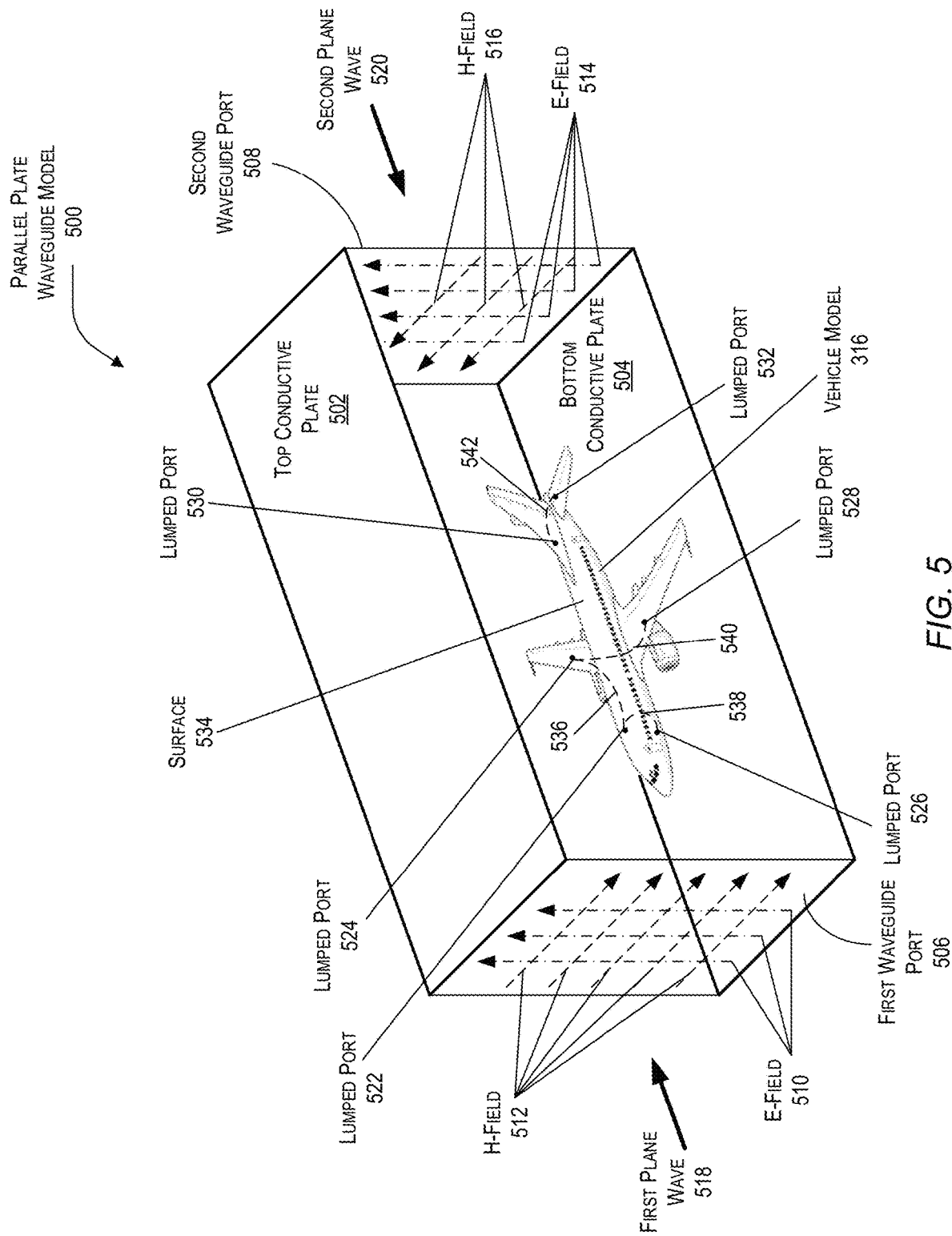
FIG. 5 is a system diagram of an example of an implementation of a plane wave port set-up of a parallel plate waveguide model for use by the system and method shown in FIGS. 3 and 4 in accordance with the present disclosure.

Turning to FIG. 5, a system diagram of an example of an implementation of a plane wave port set-up of a parallel plate waveguide model 500 for use by the system 300 and method 400 is shown in accordance with the present disclosure. In this example, the parallel plate waveguide model 500 is shown as a three-dimensional (3D) computational model generated 408 by the system 300. The parallel plate waveguide model 500 includes a top conductive plate 502 and a bottom conductive plate 504 having a first waveguide port 506 and a second waveguide port 508 at opposite sides of the parallel plate waveguide model 500. The first waveguide port 506 has a first electric field (E-Field) 510 and a first magnetic field (H-Field) 512 and the second waveguide port 508 has a second E-Field 514 and a second H-Field 516. The vehicle model 316 is inserted 410 into the parallel plate waveguide model 500. The vehicle model 316 has electrical ports and connecting cables inside which will be influenced by electromagnetic waves that penetrate inside the vehicle model 316.

In this example, a plane wave illumination for a high-intensity radiated field (HIRF) and/or an electromagnetic pulse (EMP) is conducted inside the parallel plate waveguide model 500, where a pair of plane waves (i.e., a first plane wave 518 and a second plane wave 520) are incident on the inserted vehicle model 316. The first plane wave 518 and second plane wave 520 travel in opposite directions and with opposite field polarizations towards the vehicle model 316.

In this example, the vehicle model 316 is shown as located at approximately the center position within the parallel plate waveguide model 500 facing the first waveguide port 506. The vehicle model 316 is shown as comprising a plurality of lumped ports. For the purposes of illustration, six lumped ports 522, 524, 526, 528, 530, and 532 are shown along a surface 534 of the vehicle model 316. It is appreciated by those of ordinary skill in the art that the six (6) lumped ports 522, 524, 526, 528, 530, and 532 are not a limitation on the number of lumped ports that may be utilized with the vehicle model 316 and any number of lumped ports may be utilized instead of just six (6) lumped ports without departing from the scope of the present disclosure. Moreover, the vehicle model 316 may also include lumped ports (not shown) that are inside the vehicle model 316.

The vehicle model 316 is also shown, as an example, to include a plurality of cable connections that may be part of a cable harness for electrically connecting multiple lumped ports that represent component terminals inside the vehicle model 316. For example, the first lumped port 522 is shown electrically connected to the second lumped port 524 with a first cable connection 536 and to the third lumped port 526 with a second cable connection 538. The second lumped port 524 is also shown electrically connected to the fourth lumped port 528 with a third cable connection 540 and the fifth lumped port 530 is shown electrically connected to the sixth lumped port 532 with a fourth cable connection 542. In this example, the first cable 536, the second cable 538, the third cable 540, and the fourth cable 542 are located within the vehicle model 316.

In an example of operation, the computing device 302 sets up the parallel plate waveguide model 500 in a 3D electromagnetic field solver and places the vehicle model 316 within the parallel plate waveguide model 500. As discussed earlier, the vehicle model 316 includes the electrical ports (i.e., lumped ports 522, 524, 526, 528, 530, and 532) and the connecting cables (i.e., cables 536, 538, 540, and 542) that are inside the vehicle model 316 and which will be influenced by the electromagnetic waves penetrating inside the vehicle model 316. The computing device 302 then executes the 3D electromagnetic field solver where each port is individually excited while the other ports passively receive electromagnetic waves (i.e., energy) from the excited port. Again, in this example, the lumped ports represent the electrical terminals onboard the vehicle model 316 and the wave ports (i.e., the first waveguide port 506 and the second waveguide port 508 of the parallel plate waveguide model 500) represent the plane wave illumination of the vehicle model 316. As a result, this process will extract the S-parameter model (i.e., the S-parameter matrix) for the vehicle model 316. The computing device 302 then calculates the S-parameter model from the output data produced by the 3D electromagnetic field solver where the output data is E-field and H-field data. The S-parameter model is formatted in an industry standard data file format (e.g., a Touchstone file) that may be a compact ASCII text file and then is saved in the storage 304.

In this example, when the 3D electromagnetic field solver is finished running, the computing device 302 may calculate the scaling factor from the waveguide port power (at the first waveguide port 506 or the second waveguide port 508) compared to the lumped port power (at the lumped ports 522, 524, 526, 528, 530, and 532). Generally, the lumped ports (i.e., lumped ports 522, 524, 526, 528, 530, and 532) correspond to the electrical terminals that push a relatively low amount of power into the system while the first waveguide port 506 and/or the second waveguide port 508 correspond to radiated plane waves that have power levels injected into the parallel plate waveguide model 500 that depend upon the size of the waveguide cross section of the parallel plate waveguide model 500 and the power density of the incident plane wave (i.e., the first plane wave 518 and/or the second plane wave 520). This difference in power level among the waveguide ports and lumped ports is taken into account when the computing device 302 utilizes the resulting S-parameter model with any future mixed-port type of excitations.

Figure 6:
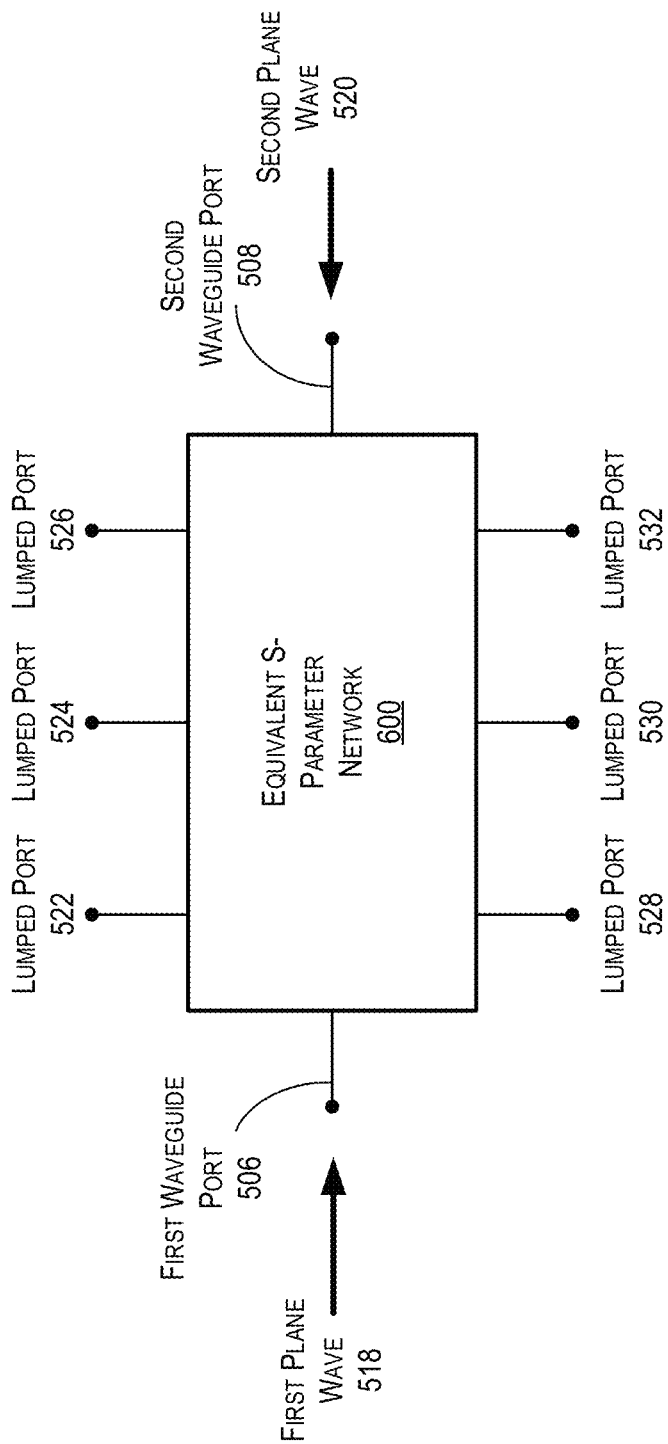
FIG. 6 is a system diagram of an example of an implementation of an equivalent S-parameter network of the plane wave port set-up of the parallel plate waveguide model shown in FIG. 5 in accordance with the present disclosure.

In FIG. 6, a system diagram of an example of an implementation of an equivalent S-parameter network 600 of the plane wave port set-up of the parallel plate waveguide model 500 is shown in accordance with the present disclosure. In this example, the equivalent S-parameter network 600 is shown as an eight (8) port network having the pair of waveguide ports (i.e., the first waveguide port 506 and the second waveguide port 508) and the six (6) lumped ports (i.e., the first lumped port 522, the second lumped port 524, the third lumped port 526, the fourth lumped port 528, the fifth lumped port 530, and the sixth lumped port 532).

It is appreciated by those of ordinary skill in the art that utilizing the equivalent S-parameter network 600 is preferable in modeling the electromagnetic characteristics of the vehicle 124 because scattering variables and scattering parameters (i.e., S-parameters) are especially useful in dealing with microwave circuits since S-parameters relate to signal flow rather than to voltages and currents directly. Moreover, S-parameters are preferred for characterizing microwave circuits because S-parameters are measured in a matched impedance system, in contrast to the open-circuit type and short-circuit type of measurements required for other available network parameters that can be very difficult to implement at microwave frequencies.

For a generic multi-port network, where the i-th ports are numbered from i=1 to N, where N is the total number of ports, the scattering variables at a given port are defined in terms of the port voltage $V_i$, port current $I_i$, and a normalized characteristic impedance $Z_0$. In general, the voltage and current at an i-th port may have their own phase angle relative to some previously established reference phase and may be described by $$V_i = |V_i| \text{angle } \theta \text{ and } I_i = |I_i| \text{angle } \varnothing.$$

As such, the average power flowing into the i-th port is then defined as $$P_i = |V_i||I_i|\cos(\theta - \varnothing).$$

Therefore, for the i-th port, the associated S-parameter definition is in terms of incident and reflected "power waves" that are known as an incident scattering variable $a_i$ and reflected scattering variable $b_i$, defined by $$a_i + b_i = \frac{V_i}{\sqrt{Z_0}} \text{ and } a_i - b_i = I_i\sqrt{Z_0}.$$

In this example, the incident scattering variable $a_i$ and reflected scattering variable $b_i$, are vectors $\vec{a}$ and $\vec{b}$ and the S-parameters are elements of a scattering matrix $\vec{S}$ that is defined by $\vec{b} = \vec{S} \cdot \vec{a}$. Utilizing explicit components, this may also be expressed as $$\begin{bmatrix} b_1 \\ \vdots \\ b_i \end{bmatrix} = \begin{bmatrix} S_{11} & \cdots & S_{1i} \\ \vdots & \ddots & \vdots \\ S_{i1} & \vdots & S_{ii} \end{bmatrix} \begin{bmatrix} a_1 \\ \vdots \\ a_i \end{bmatrix}.$$

As such, the relationship between the reflected (i.e., reflected scattering variable $b_i$) and incident power waves (incident scattering variable $a_i$) at each port of the multi-port network is expressed in terms of the multi-port network's individual S-parameters (i.e., $S_{11}$ to $S_{ii}$). The individual S-parameters may be measured when the multi-port network is impedance matched for zero reflections for a given port that is being measured, where the multi-port network is impedance matched by terminating the other ports with matching terminations that eliminate the reflections on the terminated ports.

In this example, the equivalent S-parameter network 600 is an eight (8) port network where two ports correspond to the first waveguide port 506 and second waveguide port 508 and six (6) lumped ports 522, 524, 526, 528, 530, and 532 as shown on the vehicle model 316 in FIG. 5. The equivalent S-parameter network 600 represents the S-parameter model for the vehicle model 316 generated by the method 400 in step 402. As such, the equivalent S-parameter network 600 may be utilized in executing the simulation of the method 400 in step 406. In this example, the equivalent S-parameter network 600 is the S-parameter model that is stored in the storage 304.

In general, the process of generating 402 the S-parameter model may be computationally intensive. For example, the computing device 302 may take a few days of computation time and require a large amount of memory 308 (as an example, tens of gigabytes in size) to perform the method 400 steps of 408 through 418. However, once the S-parameter model (i.e., equivalent S-parameter network 600) is created, the equivalent S-parameter network 600 may be a relatively small (e.g., less than tens of megabytes in size). The computing device 302 may then utilize the equivalent S-parameter network 600 to run various transient analysis quickly that may be, for example, less than a few minutes of computation time.

The computing device 302 may run these various transient analyses by connecting circuit/system elements to the S-parameter ports (i.e., the first waveguide port 506, the second waveguide port 508, and the lumped ports 522, 524, 526, 528, 530, and 532) of the equivalent 5-parameter network 600. The computing device 302 may then set up excitation terminals at the 5-parameter ports in a transient circuit simulation tool, where the scaling factor has been applied to the waveform amplitudes of the first waveguide port 506 and the second waveguide port 508 to emulate the plane wave illumination of the vehicle 124. The computing device 302 then may run a time-domain circuit simulation and then retrieve the results. In this example, the resulting waveforms in the voltages and currents observed at the electrical terminals of the equivalent 5-parameter network 600 (produced by the simulation tool) represent the complete system responses under a user-specified plane wave waveform impinging upon the vehicle model 316.

As a result, utilizing the disclosed system and method allows for a large saving in computer processing time since there is no need to run a complex 3D field solver on an outdoor range for each different incident plane waveform or data/power waveform scenario. Moreover, the present approach allows for the use of fast circuit/system simulation tools. Furthermore, utilizing the present approach allows for all the 3D electromagnetic interactions for on-board components, devices, modules, or system under HIRF/EMP with specific plane wave incidence scenarios to be captured in compact S-parameter data files instead of large field solver data. This allows the S-parameter data files to be readily re-usable in circuit/system level simulations at later times and the resulting data does not occupy large amounts of storage space.

It will be understood that various aspects or details of the disclosure may be changed without departing from the scope of the disclosure. It is not exhaustive and does not limit the claimed disclosures to the precise form disclosed. Furthermore, the foregoing description is for the purpose of illustration only, and not for the purpose of limitation. Modifications and variations are possible in light of the above description or may be acquired from practicing the disclosure. The claims and their equivalents define the scope of the disclosure. Moreover, although the techniques have been described in language specific to structural features and/or methodological acts, it is to be understood that the appended claims are not necessarily limited to the features or acts described. Rather, the features and acts are described as example implementations of such techniques.

Further, the disclosure comprises embodiments according to the following clauses.

Clause 1. A method for modeling electromagnetic characteristics of a vehicle having electrical components, the method comprising: generating a parallel plate waveguide model having a first waveguide port and a second waveguide port; inserting a vehicle model for the vehicle within the parallel plate waveguide model, wherein the vehicle model has a plurality of lumped ports corresponding to the electrical components on-board the vehicle; executing an electromagnetic field solver on the first waveguide port, the second waveguide port, and the plurality of lumped ports, wherein the electromagnetic field solver is executed on the first waveguide port, the second waveguide port, and the plurality of lumped ports, and wherein the electromagnetic field solver produces a first output data; determining a scaling factor between a first power level configured to excite the first waveguide port and the second waveguide port and a second power level configured to excite the plurality of lumped ports; producing a scattering parameter (S-parameter) model for the vehicle from the first output data, wherein the S-parameter model includes a plurality of S-parameter ports; generating a plurality of excitation signals at the plurality of S-parameter ports, wherein the scaling factor has been applied to the plurality of excitation signals; and executing a time-domain circuit simulation to model the electromagnetic characteristics of the vehicle.

Clause 2. The method of clause 1, wherein the vehicle model is predetermined.

Clause 3. The method of clauses 1 or 2, further comprising saving the S-parameter model in a storage, wherein the S-parameter model is reusable for executing a system level transient simulation utilizing the S-parameter model.

Clause 4. The method of clause 3, wherein the S-parameter model is saved in the storage as a touchstone file.

Clause 5. The method of clauses 3 or 4, further comprising retrieving the S-parameter model from the storage prior to generating the plurality of excitation signals.

Clause 6. The method of clauses 1, 2, 3, 4, or 5, wherein each lumped port of the plurality of lumped ports is configured to have electrical properties corresponding to an on-board system of the vehicle and wherein the first waveguide port and the second waveguide port are configured to simulate a plane wave illumination of the vehicle.

Clause 7. The method of clauses 1, 2, 3, 4, 5, or 6, wherein the second power level is approximately 0.5 Watts and the first power level is determined based a cross-section of a waveguide defined by the parallel plate waveguide model and an incident plane wave generated by the electromagnetic field solver at the first waveguide port or the second waveguide port.

Clause 8. The method of clauses 1, 2, 3, 4, 5, 6, or 7, wherein the generating the plurality of excitation signals at the plurality of S-parameter ports includes connecting a circuit element to each S-parameter port to generate an excitation signal.

Clause 9. A system for modeling electromagnetic characteristics of a vehicle, the system comprising: a memory; one or more processors; a computer-readable medium in the memory, the computer-readable medium storing instructions that, when executed by the one or more processors, cause the system to perform operations comprising: generating a parallel plate waveguide model having a first waveguide port and a second waveguide port; inserting a vehicle model for the vehicle within the parallel plate waveguide model, wherein the vehicle model has a plurality of lumped ports corresponding to electrical components on-board the vehicle; executing an electromagnetic field solver on the first waveguide port, the second waveguide port, and the plurality of lumped ports, wherein the electromagnetic field solver is executed on the first waveguide port, the second waveguide port, and the plurality of lumped ports, and wherein the electromagnetic field solver produces a first output data; determining a scaling factor between a first power level configured to excite the first waveguide port and the second waveguide port, and a second power level configured to excite the plurality of lumped ports; producing a scattering parameter (S-parameter) model for the vehicle from the first output data, wherein the S-parameter model includes a plurality of S-parameter ports; generating a plurality of excitation signals at the plurality of S-parameter ports, wherein the scaling factor has been applied to the plurality of excitation signals; and executing a time-domain circuit simulation to model the electromagnetic characteristics of the vehicle.

Clause 10. The system of clause 9, wherein the vehicle model is predetermined.

Clause 11. The system of clauses 9 or 10, wherein the system is further configured to perform the operation of saving the S-parameter model in a storage, wherein the S-parameter model is reusable for executing a system level transient simulation utilizing the S-parameter model.

Clause 12. The system of clause 11, wherein the S-parameter model is saved in the storage as a touchstone file.

Clause 13. The system of clauses 11 or 12, wherein the system is further configured to perform the operation of retrieving the S-parameter model from the storage prior to generating the plurality of excitation signals.

Clause 14. The system of clauses 9, 10, 11, 12, or 13, wherein each lumped port of the plurality of lumped ports is configured to have electrical properties corresponding to an on-board component of the vehicle and wherein the first waveguide port and the second waveguide port are configured to simulate a plane wave illumination of the vehicle.

Clause 15. The system of clauses 9, 10, 11, 12, 13, or 14, wherein the second power level is approximately 0.5 Watts and the first power level is determined based a cross-section of a waveguide defined by the parallel plate waveguide model and an incident plane wave generated by the electromagnetic field solver at the first waveguide port or the second waveguide port.

Clause 16. The system of clauses 9, 10, 11, 12, 13, 14, or 15, wherein the generating the plurality of excitation signals at the plurality of S-parameter ports includes connecting a circuit element to each S-parameter port to generate an excitation signal.

Clause 17. A method for modeling electromagnetic characteristics of a vehicle having electrical components, the method comprising: generating a scattering parameter (S-parameter) model for the vehicle utilizing a parallel plate waveguide model having a first waveguide port and a second waveguide port and a vehicle model having a plurality of lumped ports corresponding to the electrical components on-board the vehicle; determining a scaling factor between a first power level utilized to excite the first and second waveguide ports and a second power level utilized to excite the plurality of lumped ports; executing a system level transient simulation utilizing the S-parameter model for the vehicle and the scaling factor.

Clause 18. The method of clause 17, wherein the generating the S-parameter model comprises: generating the parallel plate waveguide model; inserting the vehicle model for the vehicle within the parallel plate waveguide model; and executing an electromagnetic field solver on the first waveguide port, the second waveguide port, and the plurality of lumped ports, wherein the electromagnetic field solver is executed on the first waveguide port, the second waveguide port, and the plurality of lumped ports, and wherein the electromagnetic field solver produces a first output data; and producing the S-parameter model for the vehicle from the first output data, wherein the S-parameter model includes a plurality of S-parameter ports.

Clause 19. The method of clauses 18, wherein the vehicle model is predetermined.

Clause 20. The method of clauses 18 or 19, wherein the executing of the system level transient simulation comprises: generating a plurality of excitation signals at the plurality of S-parameter ports, wherein the scaling factor has been applied to the plurality of excitation signals; and executing a time-domain circuit simulation to model the electromagnetic characteristics of the vehicle.

To the extent that terms "includes," "including," "has," "contains," and variants thereof are used herein, such terms are intended to be inclusive in a manner similar to the term "comprises" as an open transition word without precluding any additional or other elements. Moreover, conditional language such as, among others, "can," "could," "might" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example. Conjunctive language such as the phrase "at least one of X, Y or Z," unless specifically stated otherwise, is to be understood to present that an item, term, etc. may be either X, Y, or Z, or a combination thereof.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Moreover, the operations of the example processes are illustrated in individual blocks and summarized with reference to those blocks. The processes are illustrated as logical flows of blocks, each block of which can represent one or more operations that can be implemented in hardware, software, or a combination thereof. In the context of software, the operations represent computer-executable instructions stored on one or more computer-readable medium that, when executed by one or more processing units, enable the one or more processing units to perform the recited operations. Generally, computer-executable instructions include routines, programs, objects, modules, components, data structures, and the like that perform particular functions or implement particular abstract data types. The order in which the operations are described is not intended to be construed as a limitation, and any number of the described operations can be executed in any order, combined in any order, subdivided into multiple sub-operations, and/or executed in parallel to implement the described processes. The described processes can be performed by resources associated with one or more device(s) such as one or more internal or external CPUs or GPUs, and/or one or more pieces of hardware logic such as FPGAs, DSPs, or other types of accelerators.

All of the methods and processes described above may be embodied in, and fully automated via, software code modules executed by one or more general purpose computers or processors. The code modules may be stored in any type of computer-readable storage medium or other computer storage device. Some or all of the methods may alternatively be embodied in specialized computer hardware.

What is claimed:

1. A method for modeling electromagnetic characteristics of a vehicle having electrical components, the method comprising:
   generating a parallel plate waveguide model having a first waveguide port and a second waveguide port;
   inserting a vehicle model for the vehicle within the parallel plate waveguide model, wherein the vehicle model has a plurality of lumped ports corresponding to the electrical components on-board the vehicle;
   executing an electromagnetic field solver on the first waveguide port, the second waveguide port, and the plurality of lumped ports, wherein the electromagnetic field solver produces a first output data;
   determining a scaling factor between a first power level configured to excite the first waveguide port and the second waveguide port and a second power level configured to excite the plurality of lumped ports;
   producing a scattering parameter (S-parameter) model for the vehicle from the first output data, wherein the S-parameter model includes a plurality of S-parameter ports;
   generating a plurality of excitation signals at the plurality of S-parameter ports, wherein the scaling factor has been applied to the plurality of excitation signals; and
   executing a time-domain circuit simulation to model the electromagnetic characteristics of the vehicle.

2. The method of claim 1, wherein the vehicle model is predetermined.

3. The method of claim 1, further comprising saving the S-parameter model in a non-transitory computer-readable storage, wherein the S-parameter model is reusable for executing a system level transient simulation utilizing the S-parameter model.

4. The method of claim 3, wherein the S-parameter model is saved in the storage as a Touchstone file.

5. The method of claim 3, further comprising retrieving the S-parameter model from the storage prior to generating the plurality of excitation signals.

6. The method of claim 1, wherein each lumped port of the plurality of lumped ports is configured to have electrical properties corresponding to an on-board system of the vehicle and wherein the first waveguide port and the second waveguide port are configured to simulate a plane wave illumination of the vehicle.

7. The method of claim 1, wherein the second power level is approximately 0.5 Watts and the first power level is determined based on a cross-section of a waveguide defined by the parallel plate waveguide model and an incident plane wave generated by the electromagnetic field solver at the first waveguide port or the second waveguide port.

8. The method of claim 1, wherein the generating the plurality of excitation signals at the plurality of S-parameter ports includes connecting a circuit element to each S-parameter port to generate an excitation signal.

9. A system for modeling electromagnetic characteristics of a vehicle, the system comprising:
   a memory;
   one or more processors;
   a non-transitory computer-readable medium in the memory, the computer-readable medium storing instructions that, when executed by the one or more processors, cause the system to perform operations comprising:
      generating a parallel plate waveguide model having a first waveguide port and a second waveguide port;
      inserting a vehicle model for the vehicle within the parallel plate waveguide model, wherein the vehicle model has a plurality of lumped ports corresponding to electrical components on-board the vehicle;
      executing an electromagnetic field solver on the first waveguide port, the second waveguide port, and the plurality of lumped ports, wherein the electromagnetic field solver produces a first output data;
      determining a scaling factor between a first power level configured to excite the first waveguide port and the second waveguide port, and a second power level configured to excite the plurality of lumped ports;
      producing a scattering parameter (S-parameter) model for the vehicle from the first output data, wherein the S-parameter model includes a plurality of S-parameter ports;
      generating a plurality of excitation signals at the plurality of S-parameter ports, wherein the scaling factor has been applied to the plurality of excitation signals; and
      executing a time-domain circuit simulation to model the electromagnetic characteristics of the vehicle.

10. The system of claim 9, wherein the vehicle model is predetermined.

11. The system of claim 9, wherein the system is further configured to perform the operation of saving the S-parameter model in a storage, wherein the S-parameter model is reusable for executing a system level transient simulation utilizing the S-parameter model.

12. The system of claim 11, wherein the S-parameter model is saved in the storage as a Touchstone file.

13. The system of claim 11, wherein the system is further configured to perform the operation of retrieving the S-parameter model from the storage prior to generating the plurality of excitation signals.

14. The system of claim 9, wherein each lumped port of the plurality of lumped ports is configured to have electrical properties corresponding to an on-board component of the vehicle and wherein the first waveguide port and the second waveguide port are configured to simulate a plane wave illumination of the vehicle.

15. The system of claim 9, wherein the second power level is approximately 0.5 Watts and the first power level is determined based on a cross-section of a waveguide defined by the parallel plate waveguide model and an incident plane wave generated by the electromagnetic field solver at the first waveguide port or the second waveguide port.

16. The system of claim 9, wherein the generating the plurality of excitation signals at the plurality of S-parameter ports includes connecting a circuit element to each S-parameter port to generate an excitation signal.

17. A method for modeling electromagnetic characteristics of a vehicle having electrical components, the method comprising:

generating a scattering parameter (S-parameter) model for the vehicle utilizing a parallel plate waveguide model having a first waveguide port and a second waveguide port and a vehicle model having a plurality of lumped ports corresponding to the electrical components onboard the vehicle;

determining a scaling factor between a first power level utilized to excite the first waveguide port and second waveguide port and a second power level utilized to excite the plurality of lumped ports;

executing a system level transient simulation utilizing the S-parameter model for the vehicle and the scaling factor.

18. The method of claim 17, wherein the generating the S-parameter model comprises:

generating the parallel plate waveguide model;

inserting the vehicle model for the vehicle within the parallel plate waveguide model; and executing an electromagnetic field solver on the first waveguide port, the second waveguide port, and the plurality of lumped ports, wherein the electromagnetic field solver produces a first output data; and producing the S-parameter model for the vehicle from the first output data, wherein the S-parameter model includes a plurality of S-parameter ports.

19. The method of claim 18, wherein the vehicle model is predetermined.

20. The method of claim 18, wherein the executing of the system level transient simulation comprises:

generating a plurality of excitation signals at the plurality of S-parameter ports, wherein the scaling factor has been applied to the plurality of excitation signals; and executing a time-domain circuit simulation to model the electromagnetic characteristics of the vehicle.

* * * * *